(12) United States Patent
Hamaguchi et al.

(10) Patent No.: US 9,484,479 B2
(45) Date of Patent: Nov. 1, 2016

(54) SOLAR CELL MODULE AND MANUFACTURING METHOD THEREOF

(71) Applicants: Tsuneo Hamaguchi, Tokyo (JP); Yoshimi Yabugaki, Tokyo (JP); Daisuke Echizenya, Tokyo (JP); Jun Fujita, Tokyo (JP); Tomoo Takayama, Tokyo (JP); Shinsuke Miyamoto, Tokyo (JP)

(72) Inventors: Tsuneo Hamaguchi, Tokyo (JP); Yoshimi Yabugaki, Tokyo (JP); Daisuke Echizenya, Tokyo (JP); Jun Fujita, Tokyo (JP); Tomoo Takayama, Tokyo (JP); Shinsuke Miyamoto, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 7 days.

(21) Appl. No.: 14/352,114

(22) PCT Filed: Oct. 17, 2012

(86) PCT No.: PCT/JP2012/076866
§ 371 (c)(1),
(2) Date: Apr. 16, 2014

(87) PCT Pub. No.: WO2013/069425
PCT Pub. Date: May 16, 2013

(65) Prior Publication Data
US 2014/0251409 A1 Sep. 11, 2014

(30) Foreign Application Priority Data

Nov. 9, 2011 (JP) .................. 2011-245714

(51) Int. Cl.
*H01L 31/05* (2014.01)
(52) U.S. Cl.
CPC ........... *H01L 31/05* (2013.01); *H01L 31/0512* (2013.01); *Y02E 10/50* (2013.01)

(58) Field of Classification Search
CPC .......................... H01L 31/0512; H01L 31/05
See application file for complete search history.

(56) References Cited

U.S. PATENT DOCUMENTS 5,296,043 A * 3/1994 Kawakami ...... H01L 31/022425
136/244
5,391,235 A * 2/1995 Inoue ................ H01L 31/03921
136/244

(Continued)

FOREIGN PATENT DOCUMENTS

CN 101373796 A 2/2009
JP 2000-261012 A 9/2000

(Continued)

OTHER PUBLICATIONS

Office Action (Notice of Rejection) issued on Sep. 30, 2014, by the Japanese Patent Office in corresponding Japanese Patent Application No. 2013-542906 and an English translation of the Office Action. (4 pages).

(Continued)

*Primary Examiner* — Golam Mowla
(74) *Attorney, Agent, or Firm* — Buchanan Ingersoll & Rooney PC

(57) ABSTRACT

A solar cell module in the present invention includes: a wiring member electrically connecting solar cell elements to each other; and a structure in which a solder bonding portion is formed by bonding a collecting electrode, which is provided on a light receiving surface of the solar cell element, extends in a first direction parallel to the wiring member, and has a width smaller than that of the wiring member in a cross section vertical to the first direction, and the wiring member together by melting solder, a cross-sectional shape of the solder bonding portion vertical to the first direction has a shape that gradually narrows toward the collecting electrode from a lower surface of the wiring member, and a side surface of the solder bonding portion and a side surface of the wiring member are covered with a thermosetting resin.

8 Claims, 6 Drawing Sheets

(56) References Cited

U.S. PATENT DOCUMENTS

| | | | |
|---|---|---|---|
| 5,428,249 A * | 6/1995 | Sawayama | H01L 31/022425 136/256 |
| 6,121,542 A * | 9/2000 | Shiotsuka | H01L 31/022425 136/256 |
| 2007/0186968 A1* | 8/2007 | Nakauchi | H01L 31/022425 136/244 |
| 2008/0023069 A1 | 1/2008 | Terada et al. | |
| 2009/0032081 A1 | 2/2009 | Saita et al. | |
| 2010/0000602 A1* | 1/2010 | Gray | H01L 31/022433 136/256 |
| 2010/0126551 A1 | 5/2010 | Okamoto et al. | |
| 2010/0181011 A1 | 7/2010 | Hashimoto et al. | |
| 2011/0011454 A1 | 1/2011 | Taira | |
| 2012/0080069 A1 | 4/2012 | Ishiguro et al. | |
| 2013/0312810 A1 | 11/2013 | Hamaguchi et al. | |

FOREIGN PATENT DOCUMENTS

| | | |
|---|---|---|
| JP | 2005-217148 A | 8/2005 |
| JP | 2008-034592 A | 2/2008 |
| JP | 2009-054981 A | 3/2009 |
| JP | 2009-272406 A | 11/2009 |
| JP | 2011-035002 A | 2/2011 |
| WO | WO 2008/023795 A1 | 2/2008 |
| WO | WO 2009/011209 A1 | 1/2009 |
| WO | WO 2009/099179 A1 | 8/2009 |
| WO | WO 2010/122875 A1 | 10/2010 |
| WO | WO 2011/152309 A1 | 12/2011 |
| WO | WO 2011/152372 A1 | 12/2011 |

OTHER PUBLICATIONS

Office Action issued by the Chinese Patent Office on Jul. 3, 2015 in corresponding Chinese Application No. 201280050762.1, and English language translation of Office Action (8 pages).
International Search Report (PCT/ISA/210) mailed on Nov. 20, 2012, by the Japanese Patent Office as the International Searching Authority for International Application No. PCT/JP2012/076866.
Written Opinion (PCT/ISA/237) mailed on Nov. 20, 2012, by the Japanese Patent Office as the International Searching Authority for International Application No. PCT/JP2012/076866.

* cited by examiner

SOLAR CELL MODULE AND MANUFACTURING METHOD THEREOF

FIELD

The present invention relates to a solar cell module and a manufacturing method thereof and, particularly, to a solar cell module that is configured such that a plurality of solar cell elements are electrically connected by connecting electrodes provided in the solar cell elements to each other via wiring members.

BACKGROUND

Typical solar cell elements each include a light receiving surface that receives solar light and a back surface that does not receive solar light and are such that collecting electrodes (bus electrodes) for bonding to wiring members (tabs) and back surface electrodes are formed on the front and back sides. In a solar cell module, the wiring members alternatively connect the collecting electrodes formed on the light receiving surface of one solar cell element and the back surface electrodes formed on the back surface of another solar cell element adjacent to the solar cell element. For example, a good conductor, such as copper, is used for the wiring members.

A solar cell element includes a photoelectric conversion unit that performs photoelectric conversion on a semiconductor substrate, such as silicon, thin wire electrodes (grid electrodes) that collect photogenerated carriers generated in the photoelectric conversion unit, and collecting electrodes to be bonded to the wiring members to transfer the collected photogenerated carriers from the thin wire electrodes to the wiring members.

The collecting electrodes are electrodes for bonding the wiring members. A plurality of collecting electrodes are formed on the solar cell element such that they intersect with the thin electrodes. Both the collecting electrodes and the thin electrodes are formed by firing a conductive paste. The conductive paste, for example, contains glass or resin as a binder and particles of a highly conductive material, such as silver (Ag), as a filler.

For example, Patent Literature 1 discloses a solar cell module that is configured by bonding the wiring members made of, for example, copper, and the collecting electrodes formed of a conductive paste containing silver particles as described above together with solder.

An objective of the solar cell module described in Patent Literature 1 is to improve adhesion between the solar cells, in which a resin curing type conductive paste is used for the collecting electrodes, and the wiring members. The collecting electrodes are formed by firing a conductive paste in which a thermosetting resin composition and conductive powder are mixed. The thermosetting resin contains a resin whose glass transition point of 70% or more in volume percent is equal to or higher than 80° C. and equal to or lower than 200° C. The solar cell module is configured such that the wiring members coated with lead-free solder are soldered to the collecting electrodes.

Moreover, as another example, for example, Patent Literature 2 discloses a solar cell module that has an objective of suppressing the damage done to the solar cell elements due to flux by preventing contamination of the manufacturing facility caused by flux used when soldering the collecting electrodes of the solar cell elements and the wiring members together.

In the solar cell module described in Patent Literature 2, the collecting electrodes are configured to include projecting portions, which extend in a direction substantially parallel to the longitudinal direction of the electrodes, on the surface to which the connection tabs are connected, thereby suppressing the damage due to flux while using flux.

For typical solar cell modules, for example, tin (Sn)-based solder, such as Sn-3Ag-0.5Cu and Sn—Cu, is used. With the method of bonding with solder, in order to remove oxide and the like formed on each surface of the collecting electrodes and the wiring members, it is necessary to apply flux on the solder bonding portion of at least one of the surfaces of the collecting electrodes and the surfaces of the wiring members. When the wiring members and the collecting electrodes being pressed against each other are heated, oxide films on the surfaces of the collecting electrodes and the surfaces of the wiring members are removed by the reduction action of flux, thereby realizing bonding with solder.

Moreover, in contrast to the patent literatures described above, for example, Patent Literature 3 discloses a manufacturing method of a solar cell module in which the wiring members and the collecting electrodes are bonded together with resin adhesive.

In the manufacturing method of a solar cell module described in Patent Literature 3, in order to provide a manufacturing method of a solar cell module that can reduce the manufacturing time, after temporarily adhering the wiring members to the light receiving surface and the back surface of each of a plurality of solar cell elements at a temperature lower than the curing temperature of the resin adhesive, the solar cell elements are collectively subjected to thermocompression bonding at a temperature equal to or higher than the curing temperature of the resin adhesive.

In Patent Literature 3, thermosetting resin adhesive containing Ni balls coated with nickel (Ni), gold (Au), or the like or conductive particles obtained by coating plastic balls with Au or the like is arranged on the collecting electrodes and the arranged thermosetting resin adhesive is cured by heating the thermosetting resin adhesive in a state where the wiring members are pressed against the collecting electrodes, thereby realizing connection of the wiring members and the collecting electrodes. In this case, the physical connection between the wiring members and the collecting electrodes is realized by using the thermosetting resin adhesive and the electrical connection between the wiring members and the collecting electrodes is performed by coming into contact with the contained conductive particles. A strip-like film mainly made of an epoxy resin is used for the thermosetting resin adhesive.

CITATION LIST

Patent Literature

Patent Literature 1: Japanese Patent Application Laid-open No. 2005-217148
Patent Literature 2: Japanese Patent Application Laid-open No. 2009-272406
Patent Literature 3: WO2009/011209

SUMMARY

Technical Problem

As described above, the solar cell modules described in Patent Literature 1 and Patent Literature 2 are configured by bonding the wiring members containing copper and the collecting electrodes containing a conductive paste containing silver particles together with solder. Therefore, the problem with the method of bonding with solder is that the collecting electrodes are separated from the solar cell elements due to the thermal stress generated by a large difference in thermal expansion between the wiring members made of good conductive metal, such as copper, and the solar cell elements made of semiconductor, such as silicon.

Furthermore, as described in Patent Literature 2, flux required in the solder bonding portions spreads to portions other than the electrodes on the surfaces of the solar cell elements and contaminates the manufacturing apparatus, thereby, for example, damaging the solar cell elements. Therefore, flux is a factor in reducing yield. Moreover, because it is necessary to frequently clean the contaminated manufacturing apparatus, there is a problem in the reduction of productivity.

Moreover, in the manufacturing method of the solar cell module described in Patent Literature 3, the wiring members and the collecting electrodes are bonded together with the resin adhesive. With the method of using the thermosetting resin in this manner, the electrical connection between the wiring members and the collecting electrodes is established by the contact of conductive particles. Therefore, the electrical resistance between the wiring members and the collecting electrodes is as large as about 10 times the case where the wiring members and the collecting electrodes are bonded together with solder and thus there is a problem in that desired characteristics cannot be obtained.

Moreover, because the bonding force between the wiring members and the collecting electrodes when the resin adhesive is used is as small as about 1/10 of the case where solder is used, there is a problem in that the bonding reliability decreases.

Furthermore, the paste containing silver (Ag) particles used as a material of the collecting electrodes formed on the light receiving surfaces of the solar cell elements is extremely expensive, and, as described in, for example, Patent Literatures 1 and 3, in order to form generally used collecting electrodes with a width of 1 to 2 mm by setting the width of the collecting electrodes to be equal to or larger than that of the wiring members, a large amount of Ag is required; therefore, there is a problem in that the manufacturing cost increases.

The present invention has been achieved to solve the above problems and an object of the present invention is to provide a solar cell module that prevents separation of the collecting electrodes by bonding the collecting electrodes and the solar cell elements together with sufficient mechanical strength even when a conductive paste required for forming the collecting electrodes is reduced and that improves the bonding reliability between the wiring members and the collecting electrodes and to provide a manufacturing method thereof.

Solution to Problem

In order to solve the above problems and achieve the object, a solar cell module according to the present invention includes: a wiring member that electrically connects a plurality of solar cell elements to each other; and a structure that includes a solder bonding portion formed by bonding a collecting electrode of the solar cell element, which is provided on a light receiving surface of the solar cell element, extends in a first direction parallel to the wiring member, and has a width smaller than that of the wiring member in a cross section vertical to the first direction, and the whole lower surface of the wiring member together with molten solder, and in which the solder bonding portion has a shape that gradually narrows toward the collecting electrode and a side surface of the solder bonding portion is covered with a thermosetting resin.

Moreover, in a manufacturing method of a solar cell module according to the present invention, a manufacturing method of a solar cell module in which a plurality of solar cell elements are electrically connected to each other by a wiring member, includes: a first step of arranging a thermosetting resin composition on a collecting electrode, which is formed on a light receiving surface of the solar cell element so as to extend in a first direction parallel to the light receiving surface; a second step of, while heating to a temperature that is equal to or higher than a softening temperature of the thermosetting resin composition and is lower than a curing start temperature of the thermosetting resin composition, bringing the collecting electrode and the wiring member into contact with each other by pressing the wiring member, which is covered with solder and has a width larger than that of the collecting electrode in a cross section vertical to the first direction, toward the collecting electrode from above the thermosetting resin composition arranged in the first step, and moving the thermosetting resin composition to a lateral side of the collecting electrode; and a third step of, while heating the collecting electrode and the wiring member that are brought into contact with each other in the second step and the thermosetting resin composition that is moved in the second step to a temperature that is equal to or higher than a curing start temperature of the thermosetting resin composition and is equal to or higher than a melting point of the solder, forming a solder bonding portion by bonding the collecting electrode and the wiring member with molten solder such that the solder bonding portion is formed to have a shape that gradually narrows toward the collecting electrode, and covering a side surface of the solder bonding portion with a thermosetting resin.

Advantageous Effects of Invention

According to a solar cell module and a manufacturing method thereof in the present invention, it is possible to obtain a solar cell module that can reduce the material for forming the collecting electrodes and improves the bonding reliability between the wiring members and the collecting electrodes by suppressing separation of the collecting electrodes from the solar cell elements and to obtain a manufacturing method thereof.

BRIEF DESCRIPTION OF DRAWINGS

FIG. 4-1 is a cross-sectional view illustrating the bonding structure of the solar cell string in the first embodiment of the present invention.

FIG. 4-2 is a cross-sectional view illustrating the bonding structure of the solar cell string in the first embodiment of the present invention.

FIG. 5-1 is a cross-sectional view illustrating a manufacturing method of the solar cell module in the first embodiment of the present invention.

FIG. 5-2 is a cross-sectional view illustrating the manufacturing method of the solar cell module in the first embodiment of the present invention.

FIG. 5-3 is a cross-sectional view illustrating the manufacturing method of the solar cell module in the first embodiment of the present invention.

FIG. 5-4 is a cross-sectional view illustrating the manufacturing method of the solar cell module in the first embodiment of the present invention.

FIG. 9-1 is a plan view illustrating the structure of a solar cell string in a fourth embodiment of the present invention.

FIG. 9-2 is a plan view illustrating the structure of the solar cell string in the fourth embodiment of the present invention.

DESCRIPTION OF EMBODIMENTS

Figure 1:
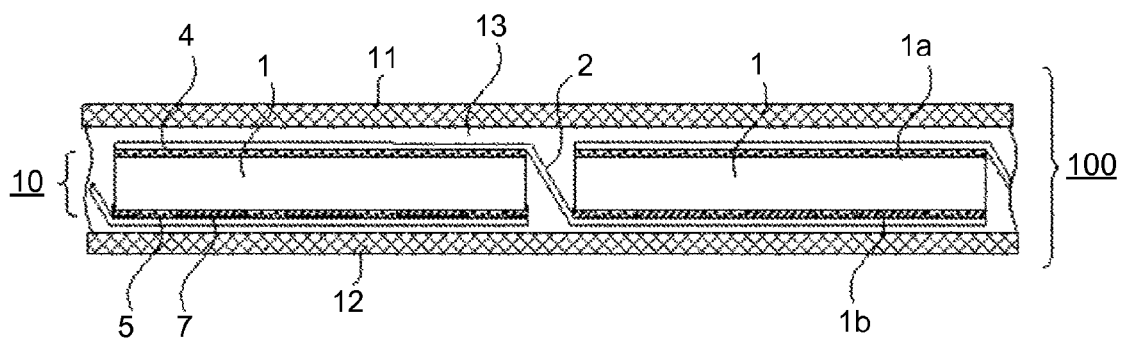
FIG. 1 is a cross-sectional view illustrating the structure of a solar cell module in a first embodiment of the present invention.

Exemplary embodiments according to the present invention will be explained below in detail with reference to the drawings. When a number, amount, or the like is referred to in the embodiments described below, the scope of the present invention is not necessarily limited to the number, amount, or the like that is referred to, unless otherwise specified. Moreover, the same reference numerals are given to the same or equivalent components and an overlapping explanation may not be repeated.

First Embodiment

Configuration of Solar Cell Module

FIG. 1 is a cross-sectional view illustrating the structure of a solar cell module 100 in a first embodiment for embodying the present invention. As illustrated in FIG. 1, the solar cell module 100 includes a solar cell string 10, in which a plurality of solar cell elements 1 are connected to each other by using wiring members 2, a light-receiving-surface protective member 11, a back-surface protective member 12, and a sealing member 13.

The solar cell string 10 is sealed between the light-receiving-surface protective member 11 arranged on the front surface side of the solar cell module 100 (a light receiving surface 1a side of the solar cell elements 1) and the back-surface protective member 12 arranged on the opposite side (a back surface 1b side of the solar cell elements 1) of the light receiving surface 1a together with the sealing member 13. In the solar cell module 100, light enters from the side of the light-receiving-surface protective member 11. As a material of the wiring members 2, for example, a good conductor, such as copper, coated with solder on its surface is used.

The light-receiving-surface protective member 11 is made of a material having translucency, is arranged on the light receiving surface 1a side of the solar cell elements 1 configuring the solar cell string 10, and protects the light receiving surface 1a side of the solar cell elements 1. As a material of the light-receiving-surface protective member 11, for example, glass or translucent plastic is used.

The back-surface protective member 12 is arranged on the surface (the back surface 1b), which is on the opposite side of the light receiving surface 1a of the solar cell elements 1 configuring the solar cell string 10, and protects the back surface 1b side of the solar cell elements 1. As a material of the back-surface protective member 12, for example, a transparent film, such as PET (Polyethylene Terephthalate), or a laminated film in which aluminum foil is Sandwiched is used.

The sealing member 13 is arranged between the solar cell string 10 and the light-receiving-surface protective member 11 and between the solar cell string 10 and the back-surface protective member 12. As a material of the sealing member 13, for example, a resin having translucency, such as EVA (Ethylene Vinyl Acetate Copolymer), silicone, and urethane, is used.

Moreover, as illustrated in FIG. 1, the solar cell string 10 includes a plurality of the solar cell elements 1 arranged in a predetermined arrangement direction and the wiring members 2. The solar cell elements 1 are spaced at predetermined intervals in the predetermined arrangement direction. In FIG. 1, although two solar cell elements 1 of the solar cell string 10 are illustrated, the number of the electrically connected solar cell elements 1 is not limited to this and the solar cell string 10 can be configured by including a larger number of the solar cell elements 1.

Figure 2:
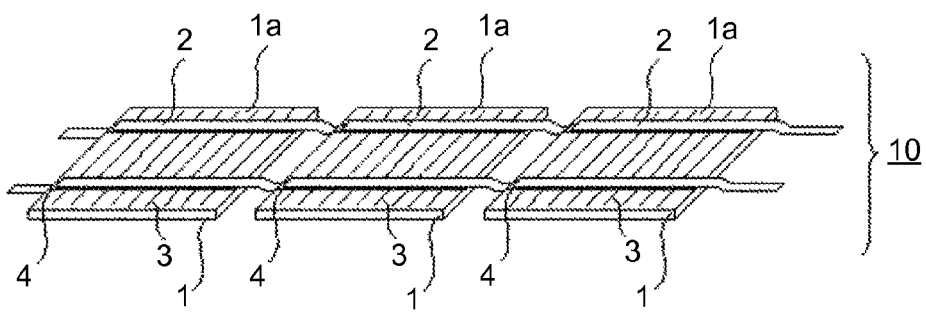
FIG. 2 is a perspective view illustrating a solar cell string in the first embodiment of the present invention.

FIG. 2 is a perspective view of the solar cell string 10 in which a plurality of the solar cell elements 1 are connected to each other by using the wiring members 2. As illustrated in FIG. 2, the solar cell elements 1 each include a photoelectric conversion unit formed on the light receiving surface 1a, thin wire electrodes (grid electrodes) 3 that collect photogenerated carriers from the photoelectric conversion unit, and collecting electrodes (bus electrodes) 4 that collect photogenerated carriers from the thin wire electrodes 3 and are bonded to the wiring members 2.

The solar cell string 10 is such that the collecting electrodes 4 formed on the light receiving surface 1a and back surface electrodes 5 formed on the back surface 1b of an adjacent solar cell element 1 are alternately connected electrically in series by the wiring members 2 as illustrated in FIG. 1 and FIG. 2. The electrode width of the wiring members 2 is set to, for example, 1 to 2 mm.

As illustrated in FIG. 2, in order to efficiently collect photogenerated carriers, for example, tens of the thin wire electrodes 3 are formed at equal intervals over the whole area in the surface of each of the solar cell elements 1. The electrode width of the thin wire electrodes 3 is set as small as tens of µm so as to increase the photoelectric conversion unit region.

The collecting electrodes 4 are electrodes for bonding the wiring members 2 and are formed to intersect with the thin wire electrodes 3. A plurality of the collecting electrodes 4, for example, two to four collecting electrodes 4, are formed on each of the solar cell elements 1. The electrode width of the collecting electrodes 4 is set to, for example, less than 1 mm. The thin wire electrodes 3 and the collecting electrodes 4 are each connected to the photoelectric conversion unit in the bottom surface portion and fixed to the light receiving surface.

The thin wire electrodes 3 and the collecting electrodes 4 are both formed by firing a conductive paste. The conductive paste, for example, contains glass or resin as a binder and particles of a highly conductive material, such as silver (Ag), as a filler. Alternatively, the collecting electrodes 4 may be formed by using a deposition method using a dry process, such as sputtering and vapor deposition, or a deposition method using a wet process, such as plating.

The photoelectric conversion unit of each of the solar cell elements 1 is, for example, configured as follows by using a p-type silicon with a thickness of 100 to 200 μm as a substrate. On the light receiving surface 1a side of the p-type silicon substrate, an n-type impurity layer (impurity diffusion region: not shown) is formed by phosphorus diffusion and moreover, an anti-reflective film including a silicon nitride film is provided by a surface treatment for improving the conversion efficiency by preventing reflection of incident light. Therefore, the first surface of the solar cell element 1, i.e., the light receiving surface 1a, is the photoelectric conversion unit (photoelectric conversion unit region).

Moreover, a p+ impurity layer containing a high-concentration impurity is formed on the second surface of the p-type silicon substrate (hereinafter, simply substrate), i.e., the back surface 1b. Moreover, as illustrated in FIG. 1, the back surface electrodes 5 are provided on the second surface in order to reflect incident light and draw power. In the above description, p-type silicon is used as a substrate; however, it is obvious that even if n-type silicon is used as a substrate, the present invention can be applied by changing the conductivity type of the impurity layer or the like.

Figure 3:
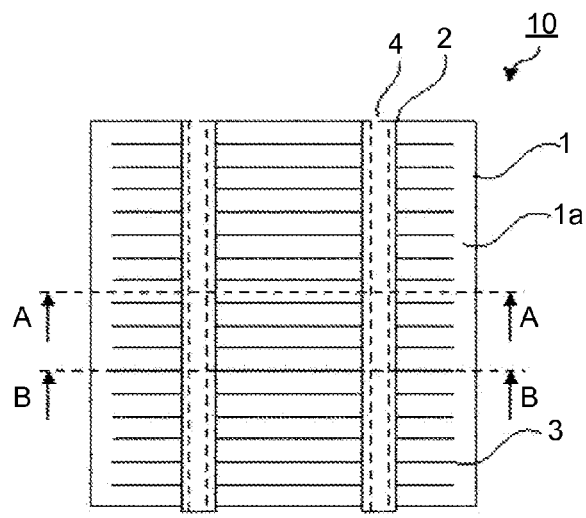
FIG. 3 is a plan view illustrating the structure of the solar cell string in the first embodiment of the present invention.

FIG. 3 is a plan view illustrating the structure of the solar cell string 10. For the convenience of the drawings, only one solar cell element 1 is illustrated. As illustrated in FIG. 3, the thin wire electrodes 3 and the collecting electrodes 4 are arranged on the light receiving surface 1a of the solar cell element 1. On the collecting electrodes 4, the wiring members 2 are further arranged such that the wiring members 2 cover the collecting electrodes 4. In FIG. 3, the collecting electrodes 4 are illustrated by dotted lines at positions overlapping with the wiring members 2.

As illustrated in FIG. 3, the collecting electrodes 4 are provided so as to intersect with the thin wire electrodes 3 and the wiring members 2 are arranged on the collecting electrodes 4 by solder bonding. Accordingly, the photogenerated carriers generated in the photoelectric conversion unit are collected in the thin wire electrodes 3, the photogenerated carriers collected in the thin wire electrodes 3 are further collected in the collecting electrodes 4, and the photogenerated carriers collected in the collecting electrodes 4 are transferred to the wiring members 2 that are bonded with solder.

Figures 1, 4:
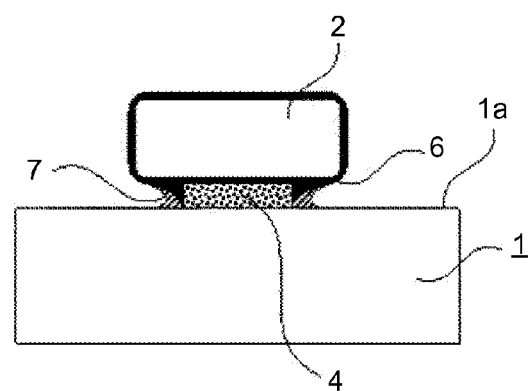
Figures 2, 4:
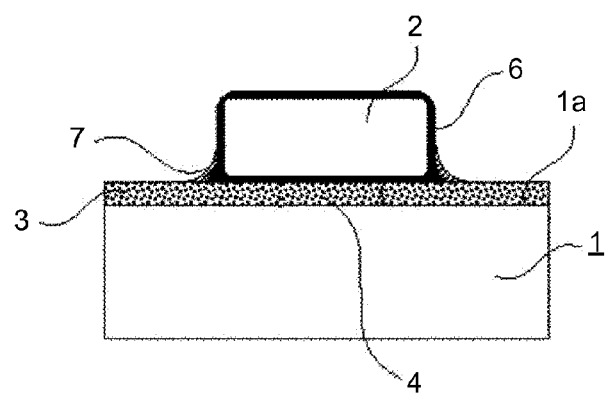

FIG. 4-1 and FIG. 4-2 are cross-sectional views illustrating the bonding structure of the solar cell string 10. FIG. 4-1 is a cross-sectional view of the solar cell element 1 illustrated in FIG. 3 taken along line A-A and FIG. 4-2 is a cross-sectional view of the solar cell element 1 illustrated in FIG. 3 taken along line B-B. As illustrated in FIG. 3, a plurality of the collecting electrodes 4 and a plurality of the thin wire electrodes 3 are formed on the light receiving surface 1a of the solar cell element 1; however, the cross section in the case where the number of the collecting electrodes 4 is one is illustrated in FIG. 4-1 and FIG. 4-2.

FIG. 4-1 is a cross-sectional view between a connecting portion, in which the collecting electrode 4 intersects with the thin wire electrode 3, and an adjacent connecting portion. The cutting plane is located between one connecting portion and an adjacent other connecting portion; therefore, as is apparent from FIG. 4-1, although the cross section of the collecting electrode 4 is illustrated, the cross section of the thin wire electrode 3 is not illustrated. As illustrated in FIG. 4-1, on the light receiving surface 1a of the solar cell element 1, the collecting electrode 4 is arranged so as to extend in a direction (first direction) that is vertical to the paper surface and is parallel to the light receiving surface 1a.

The whole lower surface of the wiring member 2 and the collecting electrode 4 are bonded together with molten solder, thereby forming a solder bonding portion 6. The solder bonding portion 6 has a cross-sectional shape that gradually narrows toward the collecting electrode 4 from the lower surface of the wiring member 2 and spreads also to the side surfaces of the collecting electrode 4. Because the shape of the solder bonding portion 6 does not have an inflection point, stress is not concentrated at any portion; therefore, solder bonding with high reliability can be realized. Moreover, because the side surfaces of the solder bonding portion 6 are covered with a thermosetting resin 7, the solder bonding portion 6 is reinforced; therefore, the bonding reliability of the solder bonding portion 6 can be further increased.

In the cross section (cross section vertical to the first direction) illustrated in FIG. 4-1, the collecting electrode 4 is smaller in width than the wiring member 2. In other words, the width of the wiring member 2 is larger than the width of the collecting electrode 4 in the cross section vertical to the direction in which the wiring member 2 and the collecting electrode 4 extend. In the present embodiment, for example, when the width of the wiring members 2 is 1 to 2 mm, and preferably 1.2 to 1.5 mm, the width of the collecting electrodes 4 is set to 0.1 to 0.8 mm, and preferably 0.4 to 0.6 mm.

Moreover, although solder coating around the wiring member 2 is used, it is satisfactory if at least the lower surface of the wiring member 2 is coated with solder.

For the material of the thermosetting resin 7, a thermosetting epoxy resin composition that, for example, contains an organic acid or uses an organic acid as a curing agent is used. For the solder 6, Pb-free solder, such as Sn-3Ag-0.5Cu (melting point of 220° C.), Sn-3.5Ag (melting point of 221° C.), Sn-0.7Cu (melting point of 230° C.), and Sn-8.8Zn (melting point of 199° C.), or low melting point Pb-free solder, such as Sn—Bi and Sn—Bi—Ag (melting point of 138° C.) may be used. Alternatively, solder containing Pb, such as Pb—Sn (melting point of 183° C.) may be used.

FIG. 4-2 is a cross-sectional view of a connecting portion in which the collecting electrode 4 intersects with the thin wire electrode 3. The cutting plane is located at the connecting portion; therefore, as is apparent from FIG. 4-2, the cross section of the thin wire electrode 3 is illustrated together with the cross section of the collecting electrode 4. As illustrated in FIG. 4-2, on the light receiving surface 1a of the solar cell element 1, the thin wire electrode 3 is arranged so as to extend in a direction (second direction) that intersects with the direction (first direction) vertical to the paper surface and is parallel to the light receiving surface 1a, and the thin wire electrode 3 is connected to the collecting electrode 4.

On the connecting portion in which the collecting electrode 4 and the thin wire electrode 3 intersect with each other, the wiring member 2 is arranged such that the solder bonding portion 6 is formed by bonding to the collecting electrode 4 and the thin wire electrode 3 with molten solder. In other words, the collecting electrode 4 and the thin wire electrode 3 of the solar cell element 1 and the wiring member 2 are bonded together with solder. In FIG. 4-2, for the sake of convenience, the position corresponding to the boundary between the collecting electrode 4 and the thin wire electrode 3 is indicated by dotted lines; however, in reality, there is no explicit boundary.

Furthermore, at least the side surfaces of the wiring member 2 and part of the upper surface of the thin wire electrode 3 are covered with the thermosetting resin 7 and the thermosetting resin 7 melts solder and bonds both the side surfaces of the wiring member 2 and the upper surface of the thin wire electrode 3 together. In this manner, the solder bonding portion 6 bonding the wiring member 2 and the thin wire electrode 3 is reinforced with the thermosetting resin 7, thereby improving the bonding reliability of the solder bonding portion 6 bonding the wiring member 2 and the thin wire electrode 3 and the collecting electrode 4.

In the present embodiment, as illustrated in the cross section in FIG. 1, the back surface electrodes 5 are provided on the back surface 1b side of each of the solar cell elements 1. The back surface electrodes 5 are provided at positions (positions overlapping with the wiring members 2 in the thickness direction of the solar cell elements 1) corresponding to the wiring members 2 on the side of the light receiving surface 1a, which is the first surface. In this embodiment, the back surface electrodes 5 are formed in an island-like manner between the thermosetting resins 7 and are bonded to the wiring members 2 by the method similar to that used for the collecting electrodes 4 on the light receiving surface 1a, which is the first surface.

The back surface electrodes 5 may be formed in an island-like manner as described above or may be formed linearly in the longitudinal direction of the solar cell elements 1, which is the same as the direction of the wiring members 2.

Moreover, as another method of bonding the back surface electrodes 5 and the wiring members 2, thermosetting adhesive containing conductive particles may be used. Because the back surface electrodes 5 are formed on the back surface 1b side on the opposite side of the light receiving surface 1a side, the electrode size can be increased. Therefore, even if thermosetting adhesive containing conductive particles is used, the connection resistance can be reduced. Moreover, the back surface electrodes 5 and the wiring members 2 may be bonded together with solder using flux as in the case of typical solder bonding.

In the present embodiment, the solar cell module 100 includes the solar cell string 10 formed by connecting the solar cell elements 1, the protective members 11 and 12, and the sealing member 13; however, the solar cell module 100 is not limited thereto and a module that does not include the protective members 11 and 12 and the sealing member 13 is also included as the solar cell module 100.

Moreover, the solar cell elements 1 in the present embodiment have a substantially flat plate shape; however, the solar cell elements 1 are not limited to having a flat plate shape and, for example, the solar cell elements 1 may have a flexible sheet shape, a cubic shape, or the like and any shape can be applied as long as the solar cell elements 1 are such that the wiring members 2 are bonded to the collecting electrodes 4 formed on the light receiving surface 1a. In the present embodiment, the solar cell string 10, in which the solar cell elements 1 are connected by the wiring members 2, is illustrated; however, the present invention is also applicable to the case where the number of the solar cell elements 1 is one.

Furthermore, the collecting electrodes 4 in the present embodiment are formed parallel to each other on the light receiving surface 1a; however, the collecting electrodes 4 may not be parallel to each other and the present invention is applicable as long as the solar cell elements 1 are such that one or more collecting electrodes 4 are formed on the light receiving surface 1a.

(Manufacturing Method of Solar Cell Module)

Figures 1, 5:
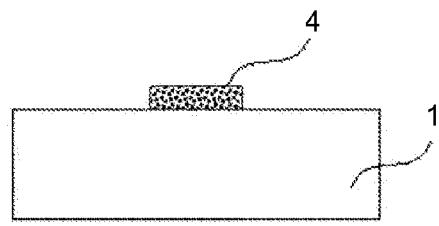
Figures 2, 5:
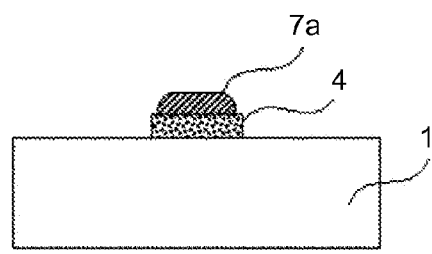
Figures 3, 5:
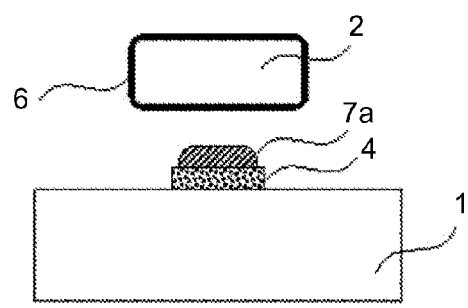
Figures 4, 5:
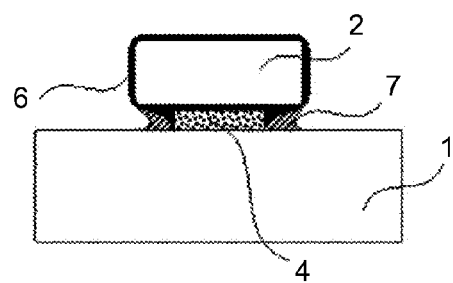

Next, the manufacturing method of the solar cell module 100 according to the present embodiment will be explained. FIG. 5-1 to FIG. 5-4 are cross-sectional views particularly for explaining in detail a method of bonding the solar cell element 1 and the wiring member 2 in the manufacturing method of the solar cell module 100 in the present embodiment.

FIG. 5-1 illustrates the initial state in the method of bonding the solar cell element 1 and the wiring member 2. A silver paste is applied to the light receiving surface 1a of the solar cell element 1 by using, for example, a screen printing method or a pressure printing method and the paste is fired at a high temperature of about 800° C. after drying, whereby the collecting electrodes 4 and the thin wire electrodes 3 (not illustrated in FIG. 5-1 to FIG. 5-4, although they are illustrated in FIG. 2 and FIG. 3) are formed. A plurality of the collecting electrodes 4 and a plurality of the thin wire electrodes 3 are formed on the light receiving surface 1a of the solar cell element 1; however, in FIG. 5-1 to FIG. 5-4, a cross section of one collecting electrode 4 is illustrated. The collecting electrode 4 is arranged so as to extend in a direction (first direction) that is vertical to the paper surface and is parallel to the light receiving surface 1a.

Next, as illustrated in FIG. 5-2, the paste-like thermosetting resin 7 before being cured (a thermosetting resin composition 7a) is arranged on the collecting electrode 4, for example, by a transfer or an ink jet method. For the thermosetting (epoxy) resin composition 7a, a curing agent that contains an epoxy resin and an organic acid or a composition that uses an organic acid as a curing agent is used. The organic acid contains a phenol curing agent and/or an acid anhydride curing agent and/or a carboxylic acid curing agent. In the thermosetting (epoxy) resin composition 7a that contains an organic acid or uses an organic acid as a curing agent, the resin composition itself exhibits flux activity (reduction of solder oxide films); therefore, it is not necessary to apply flux to the soldering portion. Thus, excellent solder bonding can be performed without using flux.

Next, as illustrated in FIG. 5-3, in the cross section vertical to the first direction, the mounting position of the wiring member 2, which is wider than the collecting electrode 4, is adjusted. The wiring member 2 is positioned immediately above the collecting electrode 4. For the wiring member 2, for example, a copper wire, which is a good conductor, coated (covered) with solder 6 is used.

FIG. 5-4 is a cross-sectional view illustrating a state after the wiring member 2 is pressed against the collecting electrode 4 and heating is performed under the conditions in two stages.

First, in the heating of the first stage, the thermosetting resin composition 7a is heated to a temperature (about 100° C.) at which the thermosetting resin composition 7a is softened and the wiring member 2 is pressurized in a direction in which the collecting electrode 4 is located to be pressed against the collecting electrode 4.

The viscosity of the thermosetting resin composition 7a becomes the lowest at a low temperature of about 100° C. Therefore, the thermosetting resin composition 7a can be easily exuded from the surface of the collecting electrode 4 with a small load and moves to the lateral sides of the collecting electrode 4, enabling the wiring member 2 and the collecting electrode 4 to come into contact with each other.

Next, in the heating of the second stage, heating is performed such that the temperature of at least the thermosetting resin composition 7a and the solder coating the wiring member 2 becomes equal to or higher than the curing start temperature of the thermosetting resin composition 7a and equal to or higher than the solder melting point (150 to 250° C.). In the process of curing the thermosetting resin composition 7a, the oxide film on the surface of the solder 6 provided on the surface of the wiring member 2 and the oxide film on the surface of the collecting electrode 4 are reduced and removed by the organic acid contained in the thermosetting resin composition 7a, and the wiring member 2 and the collecting electrode 4 are bonded together with the molted solder, thereby forming the solder bonding portion 6. At this point, the solder also spreads to the side surfaces of the collecting electrode 4 due to the action of the organic acid as flux and the wettability of the solder 6. The solder bonding portion 6 has a cross-sectional shape that gradually narrows toward the collecting electrode 4 from the lower surface of the wiring member 2. The thermosetting resin composition 7a exuded to the side surfaces of the solder bonding portion 6 is further heated and is cured on the side surfaces of the solder bonding portion 6 to become the thermosetting resin 7.

If a lamp is used as a method of heating solder in FIG. 5-4 in the present embodiment, solder can be heated without coming into contact with the wiring member 2; therefore, solder does not adhere to the heating tool even if the wiring member 2 is coated with solder. Thus, the wiring member 2 and the collecting electrode 4 can be bonded together with solder with higher productivity.

In order to surely advance the cure of the thermosetting resin composition 7a in a shorter time, in a state of being heated to the temperature that is equal to or higher than the curing start temperature of the thermosetting resin composition 7a and is equal to or higher than the solder melting point (150 to 250° C.), baking may be performed by continuing heating, for example, for 2 minutes to 1 hour.

It is also possible to complete solder bonding and curing of the thermosetting resin 7 by appropriately selecting the materials of the solder 6 and the thermosetting resin 7. The heating temperature is appropriately set in accordance with the melting point of the solder 6 to be applied and the material of the thermosetting resin 7 to be used. Moreover, in the present embodiment, the paste-like thermosetting epoxy resin composition 7a is used; however, a film in a semi-cured state (stage B) may be used.

Then, the collecting electrodes 4 formed on the light receiving surface 1a of one solar cell element 1 and the back surface electrodes 5 formed on the back surface 1b of another solar cell element 1 are electrically connected by using the wiring members 2. Such a connection is repeated, whereby the solar cell string 10, in which a plurality of the solar cell elements 1 are electrically connected to each other, is formed.

Thereafter, the solar cell string 10 is sealed in the sealing member 13, which is sandwiched between the light-receiving-surface protective member 11 and the back-surface protective member 12. By performing the above processes, the solar cell module 100 according to the first embodiment is obtained.

(Effectiveness)

In the solar cell module 100 according to the present embodiment, because there is no inflection point in the cross-sectional shape of the solder bonding portions 6 bonding the wiring members 2 and the collecting electrodes 4, stress concentration does not occur and thus the reliability of solder bonding can be improved. Moreover, the mechanical strength of the solder bonding portions 6 can be further improved by reinforcing the side surfaces of the solder bonding portions 6 with the thermosetting resin 7. Thus, an effect is obtained where the bondability between the wiring members 2 and the collecting electrodes 4 is further improved.

Accordingly, it is possible to obtain a solar cell module that improves the bonding reliability between the wiring members 2 and the collecting electrodes 4 by preventing separation of the collecting electrodes 4 even if the width of the collecting electrodes 4 is reduced, and to obtain a manufacturing method thereof.

Moreover, the electrical resistance of the bonding portions can be reduced by bonding the collecting electrodes 4 and the wiring members 2 with the solder 6.

Moreover, because the collecting electrodes 4 have a width smaller than that of the wiring members 2, it is possible to reduce the usage of a conductive paste, such as silver, necessary for forming the collecting electrodes 4. As a result, the cost of the solar cell module 100 can be reduced. In other words, it is possible to achieve both reduction of the cost by reducing the conductive paste and a highly reliable electrical connection of the wiring members 2 and the solar cell elements 1.

Furthermore, because the solder 6 also covers the side surfaces of the collecting electrodes 4, the electrical resistance of the bonding portions bonding the collecting electrodes 4 and the wiring members 2 can be further reduced.

Moreover, because the wiring members 2 include copper and the collecting electrodes 4 include silver, a highly efficient solar cell module with low electrical resistance can be obtained.

Moreover, in the thermosetting (epoxy) resin composition 7a that contains an organic acid or uses an organic acid as a curing agent, the resin composition itself exhibits flux activity (reduction of solder oxide films); therefore, the oxide films on the surfaces of the solder 6 provided on the surfaces of the wiring members 2 and the oxide films on the surfaces of the collecting electrodes 4 are reduced without using flux. Thus, it is possible to perform excellent solder bonding of the wiring members 2 and the collecting electrodes 4. Accordingly, it is possible to reduce failures due to contamination of a manufacturing apparatus that occurs when flux is used and prevent reduction in productivity due to cleaning of a manufacturing apparatus. Furthermore, a concern that residue of the flux remains on the light receiving surface 1a and residual ions cause degradation of the characteristics can be reduced.

Furthermore, in the manufacturing method of the solar cell module in the present embodiment, after the wiring members 2 and the collecting electrodes 4 are bonded together with the solder 6, baking is further performed at a temperature higher than the curing start temperature of the thermosetting resin 7; therefore, the thermosetting resin composition 7a can be cured more reliably. Accordingly, it is possible to increase the bonding strength between the collecting electrodes 4 and the solar cell elements 1; therefore, it can be ensured that separation of the collecting electrodes 4 is prevented.

Second Embodiment

Configuration of Solar Cell Module

Figure 6:
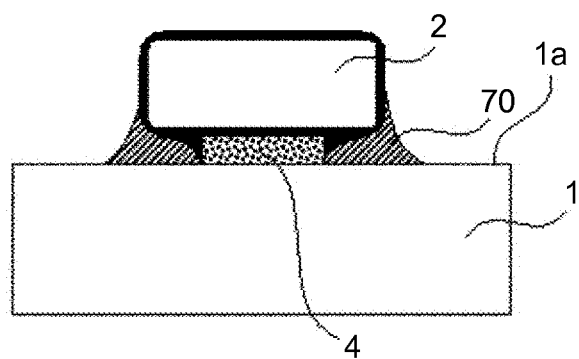
FIG. 6 is a cross-sectional view illustrating the bonding structure of a solar cell string in a second embodiment of the present invention.

FIG. 6 is a cross-sectional view illustrating the bonding structure of a solar cell string 20, which includes the solar cell elements 1 and the wiring members 2, in a solar cell module 200 in a second embodiment for embodying the present invention. Moreover, in a similar manner to FIG.

4-1, FIG. 6 is a cross-sectional view between a connecting portion, in which the collecting electrode 4 intersects with the thin wire electrode, and an adjacent connecting portion. In FIG. 6 also, on the light receiving surface 1a of the solar cell element 1, the collecting electrode 4 is arranged so as to extend in a direction (first direction) that is vertical to the paper surface and is parallel to the light receiving surface 1a.

In the first embodiment, as illustrated in FIG. 4-1 and FIG. 4-2, a case is illustrated where the bonding reliability of the solder bonding portion 6 is improved by covering the side surfaces of the solder bonding portion 6 bonding the wiring member 2 and the collecting electrode 4 with the thermosetting resin 7; however, in the second embodiment, as illustrated in FIG. 6, a thermosetting resin 70 is also fixed to the side surfaces of the wiring member 2 via the solder 6 covering the wiring member 2 and covers the side surfaces of the collecting electrode 4 so as to connect the side surfaces of the wiring member 2 covered with the solder 6 and the light receiving surface 1a.

Configurations other than those described above are substantially the same as the configurations in the first embodiment described above; therefore, the same or corresponding components are denoted by the same reference numerals and an explanation thereof is not repeated.

(Manufacturing Method of Solar Cell Module)

Figure 7:
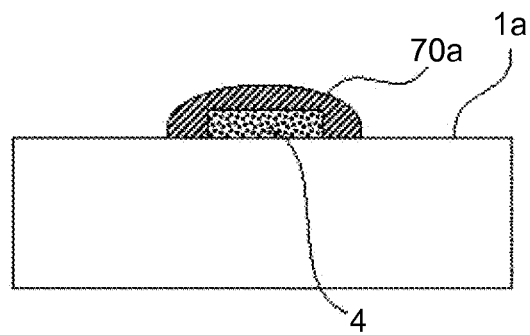
FIG. 7 is a cross-sectional view illustrating a manufacturing method of a solar cell module in the second embodiment of the present invention.

FIG. 7 is a cross-sectional view explaining a manufacturing method of the solar cell module 200 in the second embodiment and illustrates a cross section of the bonding structure of the solar cell string 20. In the first embodiment described above, as illustrated in FIG. 5-2, the thermosetting resin 7, which contains a paste-like organic acid or uses an organic acid as a curing agent, before being cured (the thermosetting resin composition 7a) is arranged such that the thermosetting resin 7 does not protrude from the collecting electrode 4. In the second embodiment, as illustrated in FIG. 7, a thermosetting resin composition 70a is arranged such that it protrudes from the collecting electrode 4 and covers part of the light receiving surface 1a.

Accordingly, when the wiring member 2 is pressed against the collecting electrode 4 and is heated, the thermosetting resin composition 70a creeps up the side surfaces of the wiring member 2 due to the wettability of the thermosetting resin composition 70a and covers the side surfaces of the wiring member 2. Therefore, as illustrated in FIG. 6, the thermosetting resin 70 is fixed not only to the bottom surface of the wiring member 2 but also to the side surfaces of the wiring member 2 via the solder and is thereby connected to the light receiving surface 1a.

As described above, the larger the amount of the thermosetting resin composition 70a covering the side surfaces of the collecting electrode 4 is, the further the bonding reliability of the wiring member 2 is improved because the thermosetting resin 70 is adhered also to the side surfaces of the wiring member 2 and the solar cell element 1. In contrast, in order to reduce the effect of blocking sunlight entering the light receiving surface 1a as much as possible, in terms of the amount of protrusion of the thermosetting resin composition 70a, it is preferable to arrange the thermosetting resin composition 70a such that it does not protrude from the wiring member 2 or to reduce the amount of protrusion in plan view from the upper surface side of the substrate.

(Effectiveness)

In the second embodiment, in the process illustrated in FIG. 7 described above, the amount of the thermosetting resin composition 70a to be arranged is increased so that the thermosetting resin composition 70a protrudes onto the light receiving surface 1a; therefore, as illustrated in FIG. 6, the wiring member 2 and the solar cell element 1 can be further firmly bonded together by the thermosetting resin 70 being fixed also to the side surfaces of the wiring member 2. Accordingly, it is possible to suppress not only separation of the collecting electrode 4 but also separation of the wiring member 2; therefore, the bonding reliability can be further improved.

Third Embodiment

Configuration of Solar Cell Module

Figure 8:
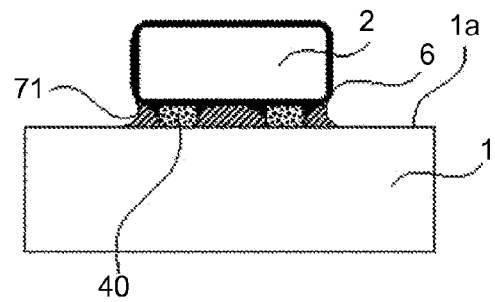
FIG. 8 is a cross-sectional view illustrating the bonding structure of a solar cell string in a third embodiment of the present invention.

FIG. 8 is a cross-sectional view illustrating the bonding structure of a solar cell string 30, which includes the solar cell elements 1 and the wiring members 2, in a solar cell module 300 in a third embodiment for embodying the present invention. Moreover, in a similar manner to FIG. 4-1, FIG. 8 is a cross-sectional view between a connecting portion, in which collecting electrodes 40 intersect with the thin wire electrode, and an adjacent connecting portion. In FIG. 8 also, on the light receiving surface 1a of the solar cell element 1, the collecting electrodes 40 are arranged so as to extend in a direction (first direction) that is vertical to the paper surface and is parallel to the light receiving surface 1a.

In the first embodiment described above, as illustrated in FIG. 4-1, a case is illustrated where one collecting electrode 4 is arranged on the light receiving surface 1a; however, in the third embodiment, as illustrated in FIG. 8, the collecting electrode 4 is divided such that two collecting electrodes 40 with a width smaller than that of the wiring member 2 are provided under the wiring member 2. The wiring member 2 is bonded to the two collecting electrodes 40 with solder and a thermosetting resin 71 reinforces the collecting electrodes 40 such that the gap between the two collecting electrodes 40 is filled, thereby fixing to the wiring member 2. Configurations other than those described above are substantially the same as the configurations in the first embodiment described above; therefore, the same or corresponding components are denoted by the same reference numerals and an explanation thereof is not repeated.

(Effectiveness)

In the present embodiment, when the wiring member 2 is pressed against the collecting electrodes 40 on which a thermosetting resin composition 71a (not illustrated) is arranged, it is possible to reduce the amount of the thermosetting resin composition 71a flowing onto the light receiving surface 1a of the solar cell element 1 by the two arranged collecting electrodes 40. Therefore, it is possible to reduce the effect of reducing the light receiving area due to the outflow of the thermosetting resin composition 71a, whereby further efficient characteristics can be obtained.

Moreover, because the collecting electrode 4 is divided, it is possible to further reduce the usage of a conductive paste necessary for forming the collecting electrodes 40 and therefore the cost can be reduced. In the present embodiment, an example where the two collecting electrodes 40 are provided is illustrated; however, a similar effect can be obtained even when the number of the collecting electrodes 40 is three or more.

Fourth Embodiment

Configuration of Solar Cell Module

Figures 1, 9:
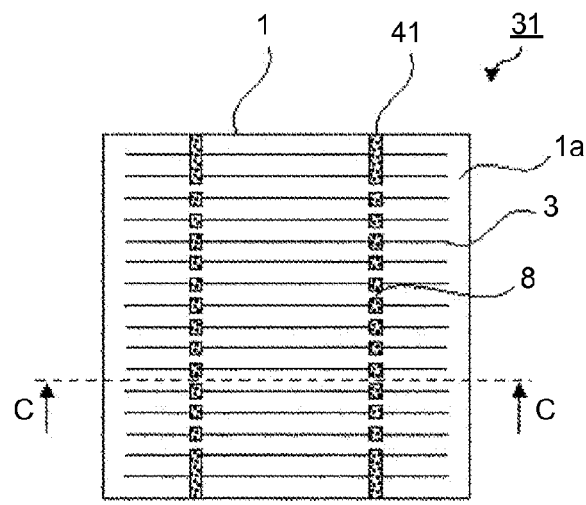
Figures 2, 9:
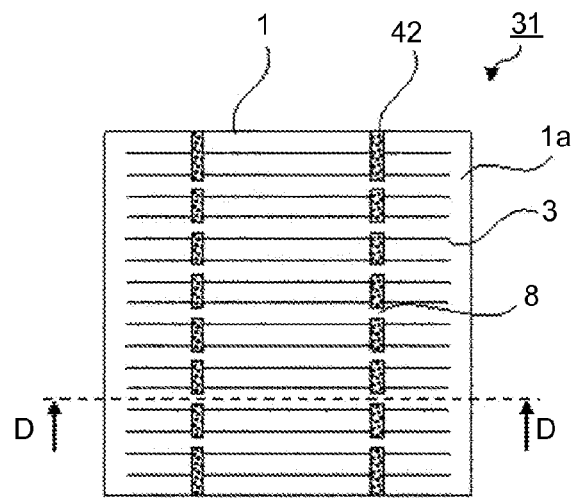
Figure 10:
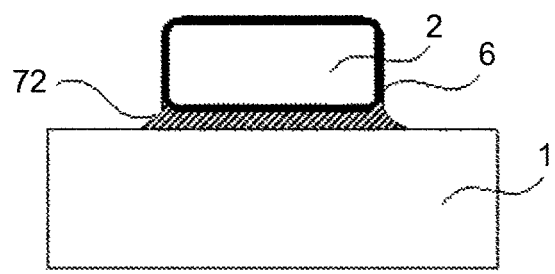
FIG. 10 is a cross-sectional view illustrating the bonding structure of the solar cell string in the fourth embodiment of the present invention.

FIG. 9-1 and FIG. 9-2 are plan views for explaining the structure of a solar cell string 31, which includes the solar cell elements 1 and the wiring members 2, in a solar cell module 400 in a fourth embodiment for embodying the present invention. FIG. 10 is a cross-sectional view illustrating the bonding structure of the solar cell element 1 and the wiring member 2 of the solar cell module 400 in the present embodiment. Moreover, FIG. 10 is a cross-sectional view of the solar cell element 1 taken along line C-C for explaining the structure of the solar cell string 31 illustrated in FIG. 9-1.

In the first embodiment described above, as illustrated in FIG. 1 to FIG. 3, a case is illustrated where each of the collecting electrodes 4 extends continuously on the light receiving surface 1a. In contrast, in the fourth embodiment, as illustrated in FIG. 9-1, on the light receiving surface 1a of the solar cell element 1, although collecting electrodes 41 are arranged so as to extend in a direction (first direction) that is vertical to the paper surface and is parallel to the light receiving surface 1a in a similar manner, part of each of the collecting electrodes 41 is removed, which is different from the first embodiment.

In other words, each of the collecting electrodes 41 is divided so as to be arranged in an island-like manner. In FIG. 9-1, in order to clearly illustrate the characteristics of the collecting electrodes 41, the wiring members 2 are omitted. Configurations other than those described above are substantially the same as the configurations in the first embodiment described above; therefore, the same or corresponding components are denoted by the same reference numerals and an explanation thereof is not repeated.

In FIG. 9-1, each removed portion 8 of the collecting electrode 41 is arranged between adjacent connecting portions avoiding the connecting portions in which the thin wire electrodes 3 intersect with the collecting electrodes 41. FIG. 10 illustrates a cross section of a portion in which the collecting electrode 41 is not present, i.e., a cross section at a position of the removed portion 8. In this embodiment, it is found that a thermosetting resin 72 fills the position of the removed portion 8 in which the collecting electrode 41 is not present and fixes the wiring member 2 and the surface of the solar cell element 1. Moreover, the cross-sectional view of a portion which is between adjacent connecting portions with thin wire electrodes 3 and in which the collecting electrode 41 is arranged is similar to FIG. 4-1 and the cross-sectional view of a connecting portion in which the collecting electrode 41 intersects with the thin wire electrode 3 is similar to FIG. 4-2.

Furthermore, as illustrated in FIG. 9-1, in the end portion of the light receiving surface 1a, the collecting electrode 41 is arranged such that the removed portion 8 is not included and the length of the electrode is larger than that in the region other than the end portion (for example, the central portion of the light receiving surface 1a). In other words, the length of each of the collecting electrodes 41, which is divided into island-like forms, in the extending direction (first direction) is larger in the end portion of the light receiving surface 1a than in the region other than the end portion.

FIG. 9-2 illustrates a modified example of the fourth embodiment. In FIG. 9-1, the collecting electrode 41 of the solar cell element 1 is such that the removed portions 8 are arranged between respective adjacent connecting portions; however, in FIG. 9-2, a collecting electrode 42 of the solar cell element 1 is such that the removed portion 8 is arranged between every two successive connecting portions. Moreover, the cross section taken along line D-D in FIG. 9-2 is also a cross section of a portion in which the collecting electrode 42 is not present, i.e., a cross section at a position of the removed portion 8, and is similar to the cross section illustrated in FIG. 10. Furthermore, the collecting electrode 42 is also arranged such that the length of the electrode in the end portion of the light receiving surface 1a is larger than that in the region other than the end portion (for example, the central portion of the light receiving surface 1a).

In order to form the removed portions 8, the removed portions 8 may be, as their name suggests, removed after the collecting electrodes are linearly printed. However, printing information on the removed portions 8 may be included in the printing pattern from the beginning and the removed portions 8 may be formed by printing electrodes divided into island-like forms at one time.

(Effectiveness)

In the present embodiment, part of the collecting electrode 41 is removed, i.e., the collecting electrode 41 is divided so as to be arranged in an island-like manner; therefore, the usage of silver (Ag) can be reduced and thus the cost can be reduced. Moreover, in the modified example of the fourth embodiment, because the collecting electrode 42 is arranged between two successive connecting portions, it becomes easy to bring a probe into contact with the collecting electrode 42 when the electrical characteristic test is performed on the solar cell elements 1.

Moreover, in the end portion of the light receiving surface 1a, the collecting electrode 41 and the collecting electrode 42 each have an electrode portion larger than that in the region other than the end portion; therefore, it is possible to suppress separation of the wiring members 2 from the end portion due to the difference in thermal expansion with respect to the solar cell element 1. This is particularly effective when the adhesion between the wiring members 2 and the surface of the solar cell element 1 in a portion in which the collecting electrode is present is larger than the adhesion due to the thermosetting resin 72 embedded in the removed portions 8.

Furthermore, the present invention is not limited to the above embodiments and can be variously modified at the execution stage without departing from the scope thereof. Moreover, the above embodiments include inventions in various stages and various inventions can be extracted by appropriately combining a plurality of disclosed components. For example, even if several components are omitted from all the components illustrated in the above embodiments, a configuration in which the several components are omitted can be extracted as an invention as long as the problems described in the section of Technical Problem can be solved and the effects described in the section of Advantageous Effects of Invention can be obtained. Furthermore, the components in different embodiments may be appropriately combined.

INDUSTRIAL APPLICABILITY

The present invention is effectively used for a solar cell module in which a plurality of solar cell elements are connected by using a wiring member and a manufacturing method thereof.

REFERENCE SIGNS LIST 1 solar cell element, 1a light receiving surface, 1b back surface, 2 wiring member, 3 thin wire electrode (grid electrode), 4, 40, 41, 42 collecting electrode (bus electrode), 5 back surface electrode, 6 solder (bonding portion), 7, 70, 71, 72 thermosetting resin, 7a, 70a, 71a thermosetting resin composition, 8 collecting electrode removed portion, 10, 20, 30, 31 solar cell string, 11 light-receiving-surface protective member, 12 back-surface protective member, 13 sealing member, 100, 200, 300, 400 solar cell module.

The invention claimed is:

1. A solar cell module comprising:
a wiring member that electrically connects a plurality of solar cell elements to each other;
a collecting electrode, which is provided on a light receiving surface of the solar cell element, extends in a first direction parallel to the wiring member, and has a width smaller than that of the wiring member in a cross section vertical to the first direction;
a region of solder that is formed by bonding the collecting electrode and the wiring member together by melting solder; and
a thermosetting resin that covers a side surface of the region of solder,
wherein a cross-sectional shape of the region of solder vertical to the first direction has a shape that gradually narrows toward the collecting electrode from a lower surface of the wiring member, and the solder spreads to a side surface of the collecting electrode, and
wherein portions of the wiring member not facing the collecting electrode are covered with the thermosetting resin.

2. The solar cell module according to claim 1, wherein the collecting electrode is arranged in a state of being divided into a plurality of portions.

3. The solar cell module according to claim 1, further comprising a plurality of thin wire electrodes each of which extends in a second direction vertical to the first direction on the light receiving surface and is connected to the collecting electrode at a position at which each of the plurality of thin wire electrodes intersects with the collecting electrode, wherein
the collecting electrode is divided between a plurality of connecting portions in which the collecting electrode is connected to each of the plurality of thin wire electrodes.

4. A manufacturing method of a solar cell module in which a plurality of solar cell elements are electrically connected to each other by a wiring member, comprising:
a first step of arranging a thermosetting resin composition on a collecting electrode, which is formed on a light receiving surface of the solar cell element so as to extend in a first direction parallel to the light receiving surface;
a second step of, while heating at a softening temperature of the thermosetting resin composition, bringing the collecting electrode and the wiring member into contact with each other by pressing the wiring member, which is covered with solder and has a width larger than that of the collecting electrode in a cross section vertical to the first direction, toward the collecting electrode from above the thermosetting resin composition arranged in the first step, and moving the thermosetting resin composition to a lateral side of the collecting electrode; and
a third step of, while heating the collecting electrode and the wiring member that are brought into contact with each other in the second step and the thermosetting resin composition that is moved in the second step to a temperature that is equal to or higher than a curing start temperature of the thermosetting resin composition and is equal to or higher than a melting point of the solder, forming a region of solder by bonding the collecting electrode and the wiring member with molten solder such that a cross-sectional shape of the region of solder has a shape that gradually narrows toward the collecting electrode from a lower surface of the wiring member, and forming a thermosetting resin on a side surface of the region of solder bonding portion by causing a thermosetting resin composition that is exuded to a side surface of the region of solder to cure,
wherein portions of the wiring member not facing the collecting electrode are covered with the thermosetting resin.

5. The manufacturing method of a solar cell module according to claim 4, wherein
the first step includes arranging the thermosetting resin composition to protrude onto the light receiving surface, and
the second step includes moving a softened thermosetting resin composition to cover part of a side surface of the wiring member.

6. The manufacturing method of a solar cell module according to claim 4, further comprising, after the third step, a fourth step of advancing cure by heating at a temperature equal to or higher than a curing start temperature of the thermosetting resin composition.

7. The manufacturing method of a solar cell module according to claim 4, wherein a lamp is used for a method of melting and heating solder in the third step.

8. The solar cell module according to claim 1, wherein a lateral side surface of the wiring member is covered with the thermosetting resin.

* * * * *